US012713792B2

(12) United States Patent
Na

(10) Patent No.: US 12,713,792 B2
(45) Date of Patent: Aug. 18, 2026

(54) DISPLAY DEVICE

(71) Applicant: LG Display Co., Ltd., Seoul (KR)

(72) Inventor: Yunjin Na, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 379 days.

(21) Appl. No.: 18/428,896

(22) Filed: Jan. 31, 2024

(65) Prior Publication Data

US 2024/0260353 A1 Aug. 1, 2024

(30) Foreign Application Priority Data

Feb. 1, 2023 (KR) ........................ 10-2023-0013537

(51) Int. Cl.
*H10K 59/131* (2023.01)
*H10K 59/122* (2023.01)
*H10K 59/124* (2023.01)

(52) U.S. Cl.
CPC ......... *H10K 59/131* (2023.02); *H10K 59/122* (2023.02); *H10K 59/124* (2023.02)

(58) Field of Classification Search
CPC ... H10K 59/131; H10K 59/122; H10K 59/124
USPC ........................................................... 257/40
See application file for complete search history.

(56) References Cited

U.S. PATENT DOCUMENTS 9,236,495 B2 * 1/2016 Seo .................... H10D 30/6756
9,263,507 B2 * 2/2016 Lee .................... H10D 30/6745
10,566,351 B2 * 2/2020 Kwon ................. H10D 86/441
10,608,199 B2 3/2020 Kim

FOREIGN PATENT DOCUMENTS

KR 10-2431788 B1 8/2022

* cited by examiner

*Primary Examiner* — Tu-Tu V Ho
(74) *Attorney, Agent, or Firm* — Birch, Stewart, Kolasch & Birch, LLP

(57) ABSTRACT

A display device includes a substrate having a display area and a non-display area having a contact area, a planarization layer disposed on the substrate and made of an organic material, a pixel electrode disposed on the planarization layer and in the display area, a connection electrode disposed on the planarization layer and in the non-display area and spaced apart from the pixel electrode, a bank disposed on the planarization layer so as to cover a portion of each of the pixel and connection electrodes, an organic light-emitting layer disposed on the pixel electrode, a common electrode disposed on the bank and the organic light-emitting layer, and an organic capping layer disposed on the common electrode. The common electrode contacts the connection electrode in the contact area.

12 Claims, 7 Drawing Sheets

FIG. 3

DISPLAY DEVICE

CROSS-REFERENCE TO RELATED APPLICATION

This application claims priority to Korean Patent Application No. 10-2023-0013537 filed on Feb. 1, 2023 in the Korean Intellectual Property Office, the entire contents of which is hereby expressly incorporated by reference into the present application.

BACKGROUND

Field

The present disclosure relates to a display device with improved bonding force between electrodes.

Discussion of Related Art

Examples of a flat panel display device can include a liquid crystal display (LCD) device, an organic light-emitting display (OLED) device, an inorganic light-emitting display device, and a quantum dot (QD) display device.

The OLED device is a self-light-emissive display device. Unlike the LCD device, the OLED device does not need a separate light source. Thus the OLED device can be manufactured in a lightweight and thin manner.

Further, the OLED device is not only advantageous in terms of power consumption due to use of low operation voltages, but also is excellent in terms of color rendering, response speed, viewing angle, and contrast ratio (CR).

An organic light-emitting element disposed in a sub-pixel of a display area of the OLED device has a structure in which an organic light-emitting layer is disposed between two electrodes, and the organic light-emitting layer emits light under an electric field generated between the two electrodes, thereby displaying an image.

SUMMARY OF THE DISCLOSURE

The organic light-emitting elements of an organic light-emitting display device are commonly connected to one of the two electrodes. In order to connect a common electrode to a low-potential line or a ground line, the common electrode and a connection electrode connected to the low-potential line are connected to each other in a specific area in a non-display area.

However, when the common electrode of the light-emitting element is in contact with the connection electrode, the common electrode can be disconnected from the connection electrode due to a weak bonding force therebetween under an external shock or impact. Thus, the organic light-emitting element may not operate properly.

Accordingly, the inventor of the present disclosure has invented a display device capable of improving a bonding force between the common electrode and the connection electrode in a non-display area of the display device.

A technical purpose according to an embodiment of the present disclosure is to provide a display device capable of preventing a common electrode from being disconnected from a connection electrode under an external impact.

Purposes according to the present disclosure are not limited to the above-mentioned purposes. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims or combinations thereof.

A display device according to one embodiment of the present disclosure includes a substrate including a display area and a non-display area, wherein the non-display area has at least one contact area disposed on at least one side of the display area; a planarization layer disposed on the substrate and made of an organic material; a pixel electrode disposed on the planarization layer and in the display area; a connection electrode disposed on the planarization layer and in the non-display area, wherein the connection electrode is spaced apart from the pixel electrode; a bank disposed on the planarization layer so as to cover a portion of the pixel electrode and a portion of the connection electrode, wherein the bank is made of an organic material; an organic light-emitting layer disposed on the pixel electrode; a common electrode disposed on the bank and the organic light-emitting layer; and an organic capping layer disposed on the common electrode, wherein the common electrode is in contact with the connection electrode in the contact area, wherein the common electrode has first holes defined therein exposing the bank, wherein the first holes are disposed in a portion of the non-display area adjacent to the contact area, and the organic capping layer is in contact with the bank through the first holes of the common electrode.

Details of the other embodiments are included in the detailed description and drawings.

According to the embodiments of the present disclosure, in the plurality of areas in the contact area, the organic capping layer contacts the intermediate contact layers made of the organic material, and the intermediate contact layers contact the planarization layer made of the organic material. The organic capping layer contacts the bank made of the organic material in the plurality of areas around the contact area. Thus, even when an external shock/impact is applied to the display device, the common electrode can be prevented effectively from being disconnected from the connection electrode in the contact area. Therefore, the common electrode of the light-emitting element (e.g., ED in the figures) can be stably connected to the low-potential line.

According to the embodiments of the present disclosure, in the plurality of areas of the contact area, the organic capping layer contacts the planarization layer made of the organic material. In the plurality of areas around the contact area, the organic capping layer contacts the bank made of the organic material. Thus, even when an external shock/impact is applied to the device, the common electrode can be prevented from being disconnected from the connection electrode in the contact area. Therefore, the common electrode of the light-emitting element (e.g., ED in the figures) can be stably connected to the low-potential line.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

BRIEF DESCRIPTION OF DRAWINGS

The present disclosure will become more fully understood from the detailed description given hereinbelow and the accompanying drawings which are given by way of illustration only, and thus are not limitative of the present disclosure.

FIG. 3 is a cross-sectional view taken along line 3-3 of FIG. 2.

DETAILED DESCRIPTION OF THE EMBODIMENTS

Figure 1:
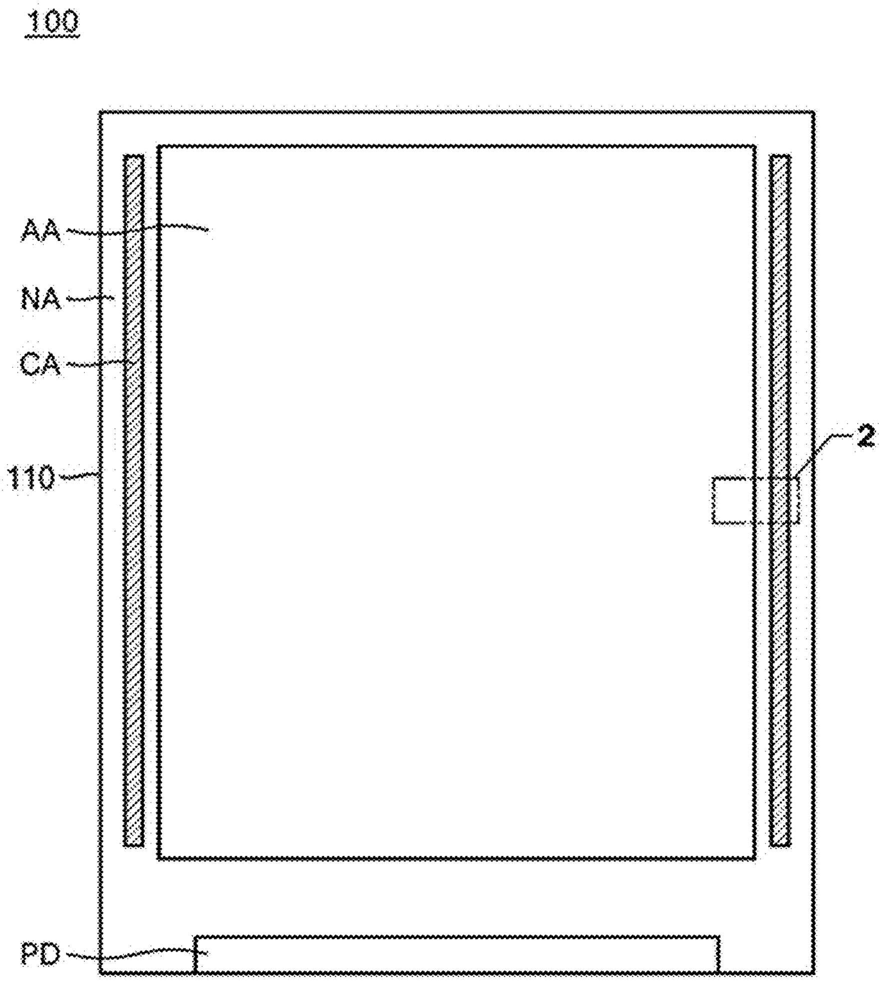
FIG. 1 is a plan view showing a display device according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but can be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as can be included in the spirit and scope of the present disclosure as defined by the appended claims.

A shape, a size, a ratio, an angle, a number, etc., disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on," "over", "above", "under", "below", etc. a second element or layer, the first element can be disposed directly on the second element or can be disposed indirectly on (or over, above, under, below, etc.) the second element with one or more additional elements or layers being disposed between the first and second elements or layers. It will be understood that when an element or layer is referred to as being "connected to", or "connected to" another element or layer, it can be directly on, connected to, or connected to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

When a certain embodiment can be implemented differently, a function or an operation specified in a specific block can occur in a different order from an order specified in a flowchart. For example, two blocks in succession can be actually performed substantially concurrently, or the two blocks can be performed in a reverse order depending on a function or operation involved.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order or sequence. Thus, a first element, component, region, layer or section described under could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

In interpreting a numerical value, the value is interpreted as including an error range unless there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. For example, unless otherwise stated or clear from the context, the expression that 'x uses a or b' means any one of natural inclusive permutations.

The terms used in the description below have been selected as being general and universal in the related technical field. However, there can be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term can be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, display devices according to embodiments of the present disclosure will be described in detail with reference to the accompanying drawings. All the components of each display device according to all embodiments of the present disclosure are operatively coupled and configured.

Figure 2:
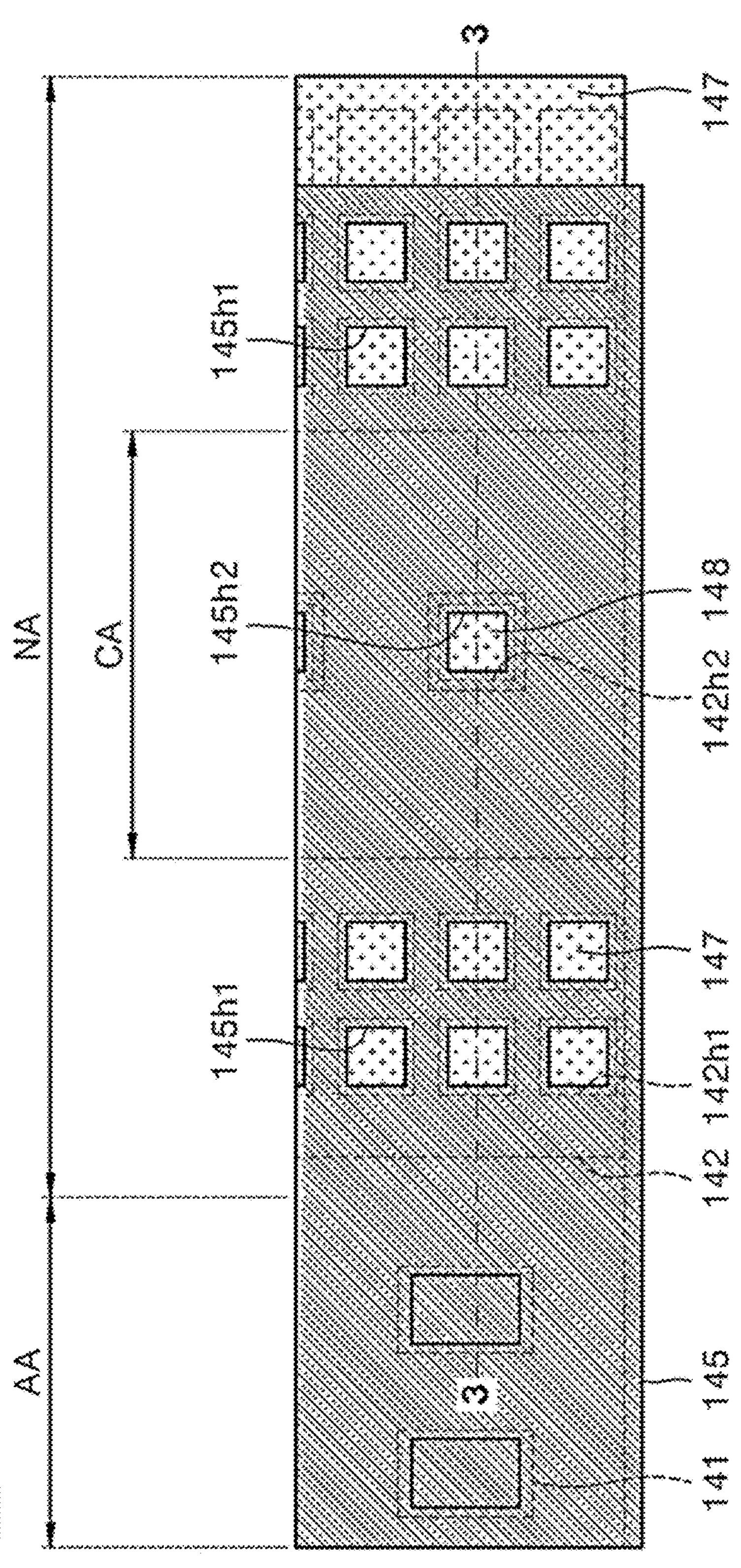
FIG. 2 is a plan view showing a partial area of FIG. 1.
Figure 3:
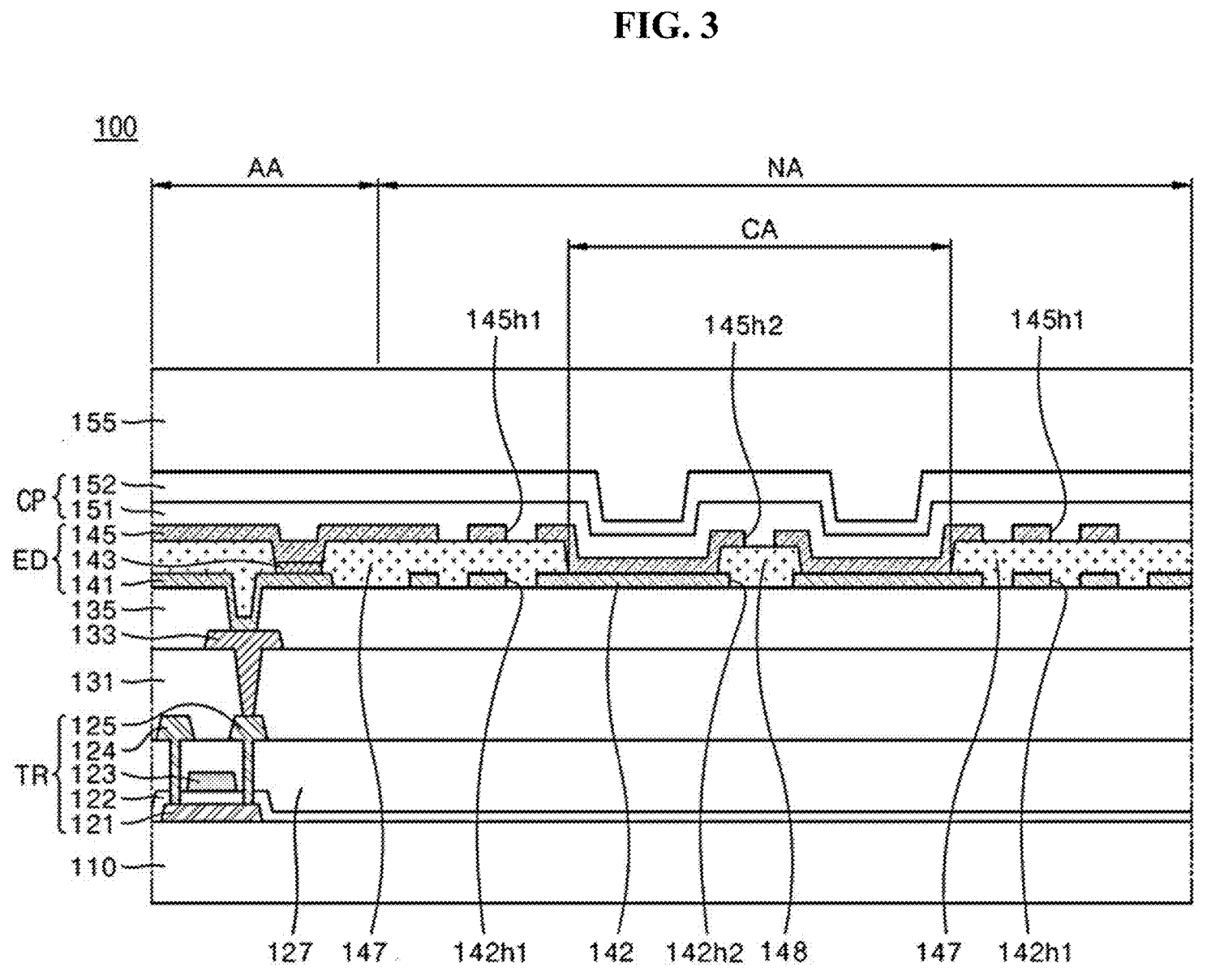

FIG. 1 is a plan view showing a display device 100 according to one embodiment of the present disclosure. FIG. 2 is a plan view showing a partial area of FIG. 1. FIG. 3 is a cross-sectional view taken along line 3-3 of FIG. 2.

Referring to FIG. 1, the display device 100 according to the embodiment of the present disclosure can include a display area (or active area) AA where an image is displayed, and a non-display area (or non-active area) NA disposed around the display area AA. The non-display area NA can include a pad area PD to which an external driving module is connected, and a contact area CA for electrical connection of a common electrode of light-emitting elements disposed in and display area AA. The display area AA, the non-display area NA, the pad area PD, and the contact area CA can be areas of the substrate 110. The non-display area NA can surround the display area AA completely or only in part.

The display area AA is an area where a plurality of pixels are arranged and thus an image is displayed. Each pixel can include a plurality of sub-pixels. Each sub-pixel is an individual unit that emits light, and can emit, for example, red light, green light, blue light, or white light. However, the present disclosure is not limited thereto. A light-emitting element and a pixel circuit area for operating the light-emitting element can be disposed in each of the sub-pixels of the display area AA. The pixel circuit area can include at least one thin-film transistor and at least one capacitor. The light-emitting element can be, for example, an organic light-emitting diode.

The non-display area NA is an area in which an image is not displayed, and is an area in which a driver circuit for driving the plurality of sub-pixels arranged in the display area AA, and various lines are disposed. For example, a gate driver circuit can be disposed in the non-display area NA. The gate driver circuit can be directly formed on the substrate and in the non-display area NA of the display device 100. In one embodiment, a data driver circuit can be further disposed in the non-display area NA. The data driver circuit can be manufactured as an IC chip which in turn can be mounted in the non-display area NA of the display device 100, or can be directly formed on the substrate and in the non-display area NA of the display device 100.

As shown in FIG. 1, the non-display area NA can be an area surrounding an edge of the display area AA. In FIG. 1, the non-display area NA is shown as surrounding a rectangular display area AA. However, the present disclosure is not limited thereto. Each of the display area AA and the non-display area NA can have a shape suitable for a design of an electronic device into which the display device 100 is mounted. An example of the shape of the display area AA can be pentagonal, hexagonal, circular, elliptical, or the like. However, the present disclosure is not limited thereto.

The pad area PD can be disposed at one side of the non-display area NA. In one example, the pad area PD can be disposed on a lower side of the display area AA. The external driving module can be connected to the pad area PD. The external driving module can include, for example, at least one of a flexible printed circuit board on which a timing controller and a power management IC chip are mounted, or a chip on film on which a data driver is mounted.

The contact area CA is a portion of the non-display area NA, and can be positioned on each of left and right sides of the display area AA. In one embodiment, the contact area CA can be disposed only on the left side of the display area AA or only on the right side of the display area AA. In one embodiment, the contact area CA can be disposed on each of the left and right sides and an upper side of the display area AA. In one embodiment, the contact area CA can be disposed on each of the left and upper sides of the display area AA, or can be disposed on each of the right and upper sides of the display area AA. The contact area CA is an area where electrical contact is formed so as to apply a predetermined voltage (for example, a low-potential voltage) to the common electrode of the light-emitting elements.

Signal lines can be disposed between the display area AA and the pad area PD.

Referring to FIG. 2 and FIG. 3, the display device 100 according to one embodiment of the present disclosure can include a thin-film transistor TR, an interlayer connection electrode 133, a light-emitting element ED, a capping layer CP, and an encapsulation layer 155 disposed on a substrate 110.

The substrate 110 can include a glass or plastic material. For example, the substrate 110 can be composed of a single layer or multiple layers including at least one of polyimide, polyethylene terephthalate, polyethylene naphthalate, polycarbonate, polyethersulfone, polyarylate, polysulfone, and cyclic-olefin copolymer. However, the present disclosure is not limited thereto. In one embodiment, the substrate 110 can be made of polyimide.

The thin-film transistor TR can be disposed on the display area AA of the substrate 110. A buffer layer can be formed over an entire surface of the substrate 110 to protect the thin-film transistor TR from moisture, oxygen, etc. having passed through the substrate 110. The buffer layer can be composed of a single layer or multiple layers made of an inorganic insulating material such as silicon nitride, silicon oxide, and silicon oxynitride. However, the present disclosure is not limited thereto.

The thin-film transistor TR can include a semiconductor layer 121 including an amorphous silicon semiconductor, a polycrystalline silicon semiconductor or an oxide semiconductor, a gate electrode 123 disposed on the semiconductor layer 121, a gate insulating layer 122 disposed between the semiconductor layer 121 and the gate electrode 123, a source electrode 124 connected to one side of the semiconductor layer 121, and a drain electrode 125 connected to the other side of the semiconductor layer 121. The gate insulating layer 122 can be disposed over an entirety of the substrate 110. However, the present disclosure is not limited thereto. The gate insulating layer 122 can be disposed only between the gate electrode 123 and the semiconductor layer 121.

The semiconductor layer 121 can be made of an amorphous silicon semiconductor material, a polycrystalline silicon semiconductor material, or an oxide semiconductor material. However, the present disclosure is not limited thereto.

The gate insulating layer 122 can be composed of a single layer or multiple layers made of an inorganic material such as silicon oxide, silicon nitride, or silicon oxynitride. However, the present disclosure is not limited thereto.

Each of the gate electrode 123, the source electrode 124, and the drain electrode 125 can be composed of a single layer or multiple layers made of one of molybdenum (Mo), aluminum (Al), chromium (Cr), gold (Au), silver (Ag), titanium (Ti), nickel (Ni), neodymium (Nd), copper (Cu), or an alloy thereof. However, the present disclosure is not limited thereto.

An interlayer insulating layer 127 covering the gate electrode 123 can be disposed. The source electrode 124 and the drain electrode 125 can extend through the interlayer insulating layer 127 so as to be connected to the semiconductor layer 121. The interlayer insulating layer 127 can be disposed on an entirety of the display area AA and the non-display area NA of the substrate 110.

The interlayer insulating layer 127 can be composed of a single layer or multiple layers made of an inorganic material such as silicon oxide, silicon nitride, or silicon oxynitride. However, the present disclosure is not limited thereto.

A first planarization layer 131 covering the thin-film transistor TR can be disposed on the interlayer insulating layer 127. The first planarization layer 131 can be disposed on the entirety of the display area AA and the non-display area NA of the substrate 110.

The first planarization layer 131 can include or be made of an organic material. The first planarization layer 131 can be made of, for example, acryl resin, epoxy resin, phenolic resin, polyamide resin, or polyimide resin. However, the present disclosure is not limited thereto.

The interlayer connection electrode 133 can be disposed on the first planarization layer 131. The interlayer connection electrode 133 can extend through the first planarization layer 131 so as to be connected to the drain electrode 125 or the source electrode 124 of the thin-film transistor TR.

The interlayer connection electrode 133 can be composed of a single layer or multiple layers made of one of molybdenum (Mo), aluminum (Al), chromium (Cr), gold (Au), silver (Ag), titanium (Ti), nickel (Ni), neodymium (Nd), copper (Cu), or an alloy thereof. However, the present disclosure is not limited thereto.

A second planarization layer 135 covering the interlayer connection electrode 133 can be disposed on the first planarization layer 131. The second planarization layer 135 can be disposed on the entirety of the display area AA and the non-display area NA of the substrate 110.

The second planarization layer 135 can include or be made of an organic material. The second planarization layer 135 can be made of, for example, acryl resin, epoxy resin, phenolic resin, polyamide resin, or polyimide resin. However, the present disclosure is not limited thereto.

The light-emitting element ED, a connection electrode 142, a bank 147, and an intermediate contact layer 148 can be disposed on the second planarization layer 135.

The light-emitting element ED can include a pixel electrode 141, an organic light-emitting layer 143, and a common electrode 145. The pixel electrode 141 can be an anode electrode, and the common electrode 145 can be a cathode electrode.

The pixel electrode 141 can be disposed on the second planarization layer 135. Each pixel electrode 141 can be individually disposed in each sub-pixel of the display area AA. The pixel electrode 141 can extend through the second planarization layer 135 so as to be connected to the interlayer connection electrode 133. The pixel electrode 141 can be connected to the drain electrode 125 or the source electrode 124 of the thin-film transistor TR via the interlayer connection electrode 133. The pixel electrode 141 can be made of a metal material having high reflectance, such as, for example, a stack structure of aluminum (Al) and titanium (Ti) such as Ti/Al/Ti, a stack structure of aluminum and ITO such as ITO/Al/ITO, an APC alloy, or a stack structure of the APC alloy and ITO such as ITO/APC/ITO. In this regard, the APC alloy refers to an alloy of silver (Ag), palladium (Pd), and copper (Cu).

The connection electrode 142 can be spaced apart from the pixel electrode 141 and disposed in the non-display area NA. The connection electrode 142 can have first holes **142*h*1 and second holes 142*h*2 defined therein exposing the second planarization layer 135. The first holes 142*h*1 of the connection electrode 142 can be disposed in a portion of the non-display area NA adjacent to the contact area CA and can be regularly arranged so as to be spaced from each other by a predetermined spacing. The second holes 142*h*2 of the connection electrode 142 can be disposed in the contact area CA and can be regularly arranged so as to be spaced from each other by a predetermined spacing. The spacing between the second holes 142*h*2 can be larger than the spacing between the first holes 142*h*1. For example, a size of each of the second holes 142*h*2 can be equal to a size of each of the first holes 142*h*1 or can be larger than the size of each of the first holes 142*h*1**.

The first holes **142*h*1 and the second holes 142*h*2 of the connection electrode 142 can act as passages through which gases remaining in the materials constituting the first and second planarization layers 131 and 135** can be discharged.

The bank 147 can fill the first holes **142*h*1 and the second holes 142*h*2 of the connection electrode 142 so as to contact the second planarization layer 135**.

The connection electrode 142 can be made of the same material as that of the pixel electrode 141, while the connection electrode 142 and the pixel electrode 141 can be disposed in the same layer. The connection electrode 142 can be connected to a low-potential (VSS) line or a ground line disposed in the non-display area NA via the interlayer connection electrode at one side of the non-display area NA.

The bank 147 can be disposed on the display area AA and the non-display area NA. The bank 147 can be disposed on the second planarization layer 135 so as to cover a portion of the pixel electrode 141 and a portion of the connection electrode 142.

The bank 147 can have an opening defined therein exposing the remaining area of the pixel electrode 141, wherein each opening is disposed in each sub-pixel of the display area AA. The bank 147 can include the same number of openings as the number of sub-pixels.

The bank 147 may not be disposed in the contact area CA of the non-display area NA. The contact area CA can be an area where the bank 147 is not disposed.

Therefore, the common electrode 145 can contact the connection electrode 142 in the contact area CA. The common electrode 145 can be connected to the low-potential line or the ground line via the connection electrode 142.

The bank 147 can include or be made of an organic material. The bank 147 can be made of acryl resin, epoxy resin, phenolic resin, polyamide resin, polyimide resin, benzocyclobutene (BCB), etc. However, the present disclosure is not limited thereto.

The intermediate contact layers 148 can be disposed on the connection electrode 142 and in the contact area CA. Each of the intermediate contact layers 148 can fill each of the second holes **142*h*2 of the connection electrode 142 and can be disposed on a portion of the connection electrode 142. The intermediate contact layers 148 can respectively fill the second holes 142*h*2 so as to contact the second planarization layer 135. A size of each of the intermediate contact layers 148 can be larger than the size of each of the second holes 142*h*2 of the connection electrode 142**.

The intermediate contact layers 148 can be made of the same material as that of the bank 147, while the intermediate contact layers 148 and the bank 147 can be disposed in the same layer.

The organic light-emitting layer 143 can be disposed on a portion of the pixel electrode 141 exposed through the opening of the bank 147. The organic light-emitting layer 143 can include a hole injection layer, a hole transport layer, at least one light-emitting material layer, an electron transport layer, and an electron injection layer. The organic light-emitting layer 143 can emit red light, green light, blue light, or white light.

The common electrode 145 can be disposed on the organic light-emitting layer 143. The common electrode 145 can be disposed over an entirety of the display area AA, and can extend to the non-display area NA so as to be disposed in a portion of the non-display area NA. The common electrode 145 can be disposed in the contact area CA of the non-display area NA, and can contact the connection electrode 142 in the contact area CA.

The common electrode 145 can have first holes **145*h*1 and second holes 145*h*2 defined therein. The first holes 145*h*1 of the common electrode 145 can be disposed in a portion of the non-display area NA adjacent to the contact area CA and can be regularly arranged so as to be spaced from each other by a predetermined spacing. The second holes 145*h*2 of the common electrode 145 can be disposed in the contact area CA and can be regularly arranged so as to be spaced from each other by a predetermined spacing. The spacing between the second holes 145*h*2 can be larger than the spacing between the first holes 145*h*1. For example, a size of each of the second holes 145*h*2 can be equal to a size of each of the first holes 145*h*1 or can be larger than the size of each of the first holes 145*h*1**.

The first holes **145*h*1 and the second holes 145*h*2 of the common electrode 145 can be respectively disposed to overlap the first holes 142*h*1 and the second holes 142*h*2 of the connection electrode 142. The second holes 145*h*2 of the common electrode 145 can be respectively disposed on the intermediate contact layers 148. The size of each of the intermediate contact layers 148 can be larger than the size of each of the second holes 145*h*2 of the common electrode 145**.

The first holes **145*h*1 and the second holes 145*h*2 of the common electrode 145 can act as passages through which gases remaining in the materials constituting the first and second planarization layers 131 and 135** can be discharged.

When the organic light-emitting display device operates in a top emission manner, the common electrode 145 can be made of a conductive material capable of transmitting light therethrough, for example, a transparent conductive oxide (TCO) such as ITO or IZO.

The capping layer CP can be disposed on the light-emitting element ED. The capping layer CP can be disposed in the display area AA and the non-display area NA. The capping layer CP can be disposed on the common electrode 145 so as to protect the light-emitting element ED from external moisture and oxygen. Further, the capping layer CP allows the light generated from the organic light-emitting layer 143 to be efficiently emitted to the outside. The capping layer CP can include an organic capping layer 151 and an inorganic capping layer 152. The organic capping layer 151 can be disposed on the common electrode 145 of the light-emitting element ED, and the inorganic capping layer 152 can be disposed on the organic capping layer 151. The organic capping layer 151 can be disposed on the bank 147 in a portion of the non-display area NA where the common electrode 145 is not disposed.

The organic capping layer 151 can be made of, for example, the same material as the organic material constituting the light-emitting layer, or one or more materials selected from organic materials constituting the hole injection layer, the hole transport layer, the electron transport layer, and the electron injection layer. However, the present disclosure is not limited thereto. The organic capping layer 151 can have a first refractive index of 1.8 to 2.0.

The inorganic capping layer 152 can be made of an inorganic material having a refractive index lower than the first refractive index. The inorganic capping layer 152 can have a second refractive index in a range of 1.3 to 1.5. The inorganic capping layer 152 can be made of, for example, one or more inorganic materials selected from among LiF, LiO, $MgF_2$, NaF, CaO, KF, $Bi_2S_3$, $Na_5Al_3F_{14}$ and $SiO_2$. However, the present disclosure is not limited thereto.

The encapsulation layer 155 can be disposed on the capping layer CP. The encapsulation layer 155 serves to prevent oxygen or moisture from invading into the light-emitting element ED. The encapsulation layer 155 can include at least one inorganic film and at least one organic film. For example, the encapsulation layer 155 can have a triple film structure of an inorganic film/an organic film/an inorganic film.

Figure 7:
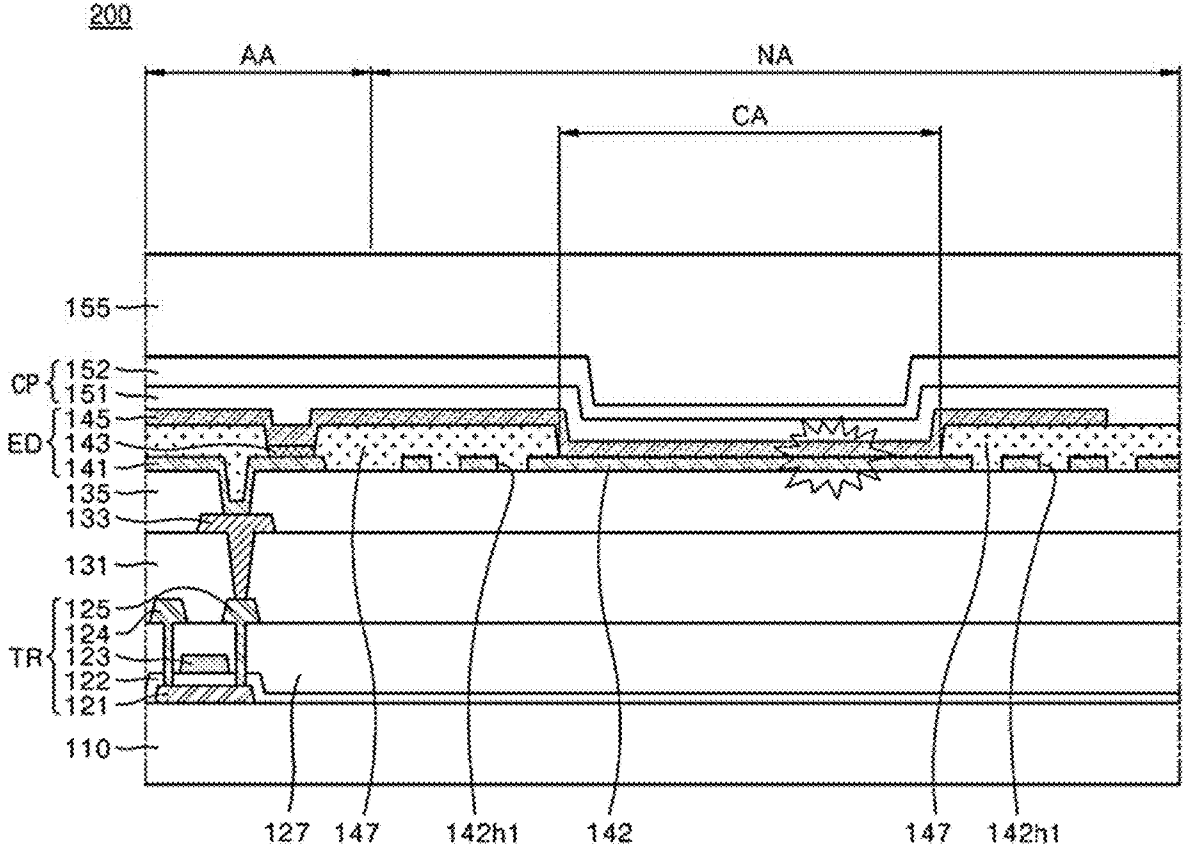
FIG. 7 is a cross-sectional view showing a display device according to an experimental example of the present disclosure.

FIG. 7 is a cross-sectional view showing a display device 200 according to an experimental example of the present disclosure.

Referring to FIG. 7, in the display device 200 according to the experimental example, unlike the display device 100 as shown in FIG. 3, the common electrode 145 of the light-emitting element ED in the non-display area NA does not have the first and second holes, and the connection electrode 142 does not have the second holes in the contact area CA, and the common electrode 145 of the light-emitting element ED contacts the connection electrode 142 in an entirety of the contact area CA.

Since the common electrode 145 of the light-emitting element ED and the connection electrode 142 are made of an inorganic material such as metal or conductive oxide, a bonding force between the common electrode 145 and the connection electrode 142 is not great.

Therefore, as in the experimental example, when the common electrode 145 of the light-emitting element ED contacts the connection electrode 142 in the entirety of the contact area CA, the common electrode 145 can be disconnected from the connection electrode 142 even with a weak external shock.

Further, the effect of the disconnection of the common electrode 145 from the connection electrode 142 can affect the display area AA to deteriorate reliability of the device.

Further, when the disconnection of the common electrode 145 from the connection electrode 142 occurs in the entirety of the contact area CA, the electrical connection of the common electrode 145 can be broken, and as a result, the light-emitting element ED may not work properly.

In contrast, in accordance with the present embodiments of the disclosure, in a plurality of areas in the contact area CA, the organic capping layer 151 contacts the intermediate contact layers 148 made of an organic material while filling the second holes **145*h*2 of the common electrode 145. The intermediate contact layers 148 contacts the planarization layer 135 made of an organic material while filling the second holes 142*h*2 of the connection electrode 142. Further, in a plurality of areas around the contact area CA, the organic capping layer 151 contacts the bank 147** made of the organic material.

When the contact is made between the organic material layers, a covalent bond or an ionic bond can be generated between the organic material layers in a process of forming the organic material layers. Thus, the binding force between the organic capping layer 151 and the intermediate contact layers 148 and the binding force between the intermediate contact layers 148 and the planarization layer 135 can be greater than the binding force between the common electrode 145 and the connection electrode 142.

Therefore, in the plurality of areas in the contact area CA, the organic capping layer 151 contacts the intermediate contact layers 148, the intermediate contact layers 148 contact the planarization layer 135. The organic capping layer 151 contacts the bank 147 in the plurality of areas around the contact area CA. Thus, even when an external shock is applied to the device, the common electrode 145 can be prevented from being disconnected from the connection electrode 142 in the contact area CA. Therefore, the common electrode 145 of the light-emitting element ED can be stably connected to the low-potential line.

Figure 4:
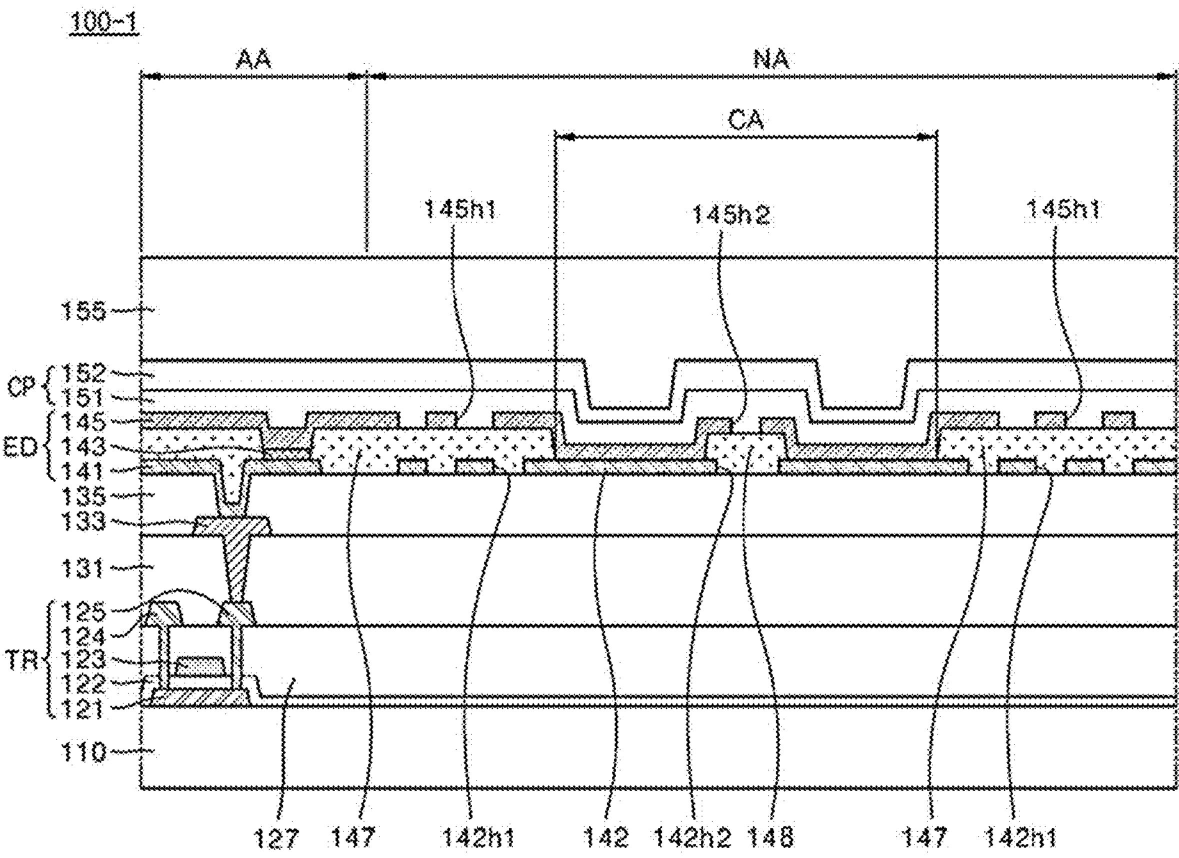
FIG. 4 is a cross-sectional view showing a display device according to one embodiment of the present disclosure.

FIG. 4 is a cross-sectional view showing a display device 100-1 according to one embodiment of the present disclosure.

Referring to FIG. 4, the display device 100-1 according to one embodiment of the present disclosure is similar to the display device 100 according to one embodiment of the present disclosure. However, the positions of the first holes **145*h*1 of the common electrode 145 of the light-emitting element ED in the display device 100-1 are different from those in the display device 100**.

In the display device 100-1, the first holes **145*h*1 of the common electrode 145 of the light-emitting element ED may not overlap the first holes 142*h*1 of the connection electrode 142**, respectively.

In a modified example, each of the first holes **145*h*1 of the common electrode 145 of the light-emitting element ED can partially overlap each of the first holes 142*h*1 of the connection electrode 142**.

The display device 100-1 according to the present embodiment can have the same effect as that of the display device 100.

Figure 5:
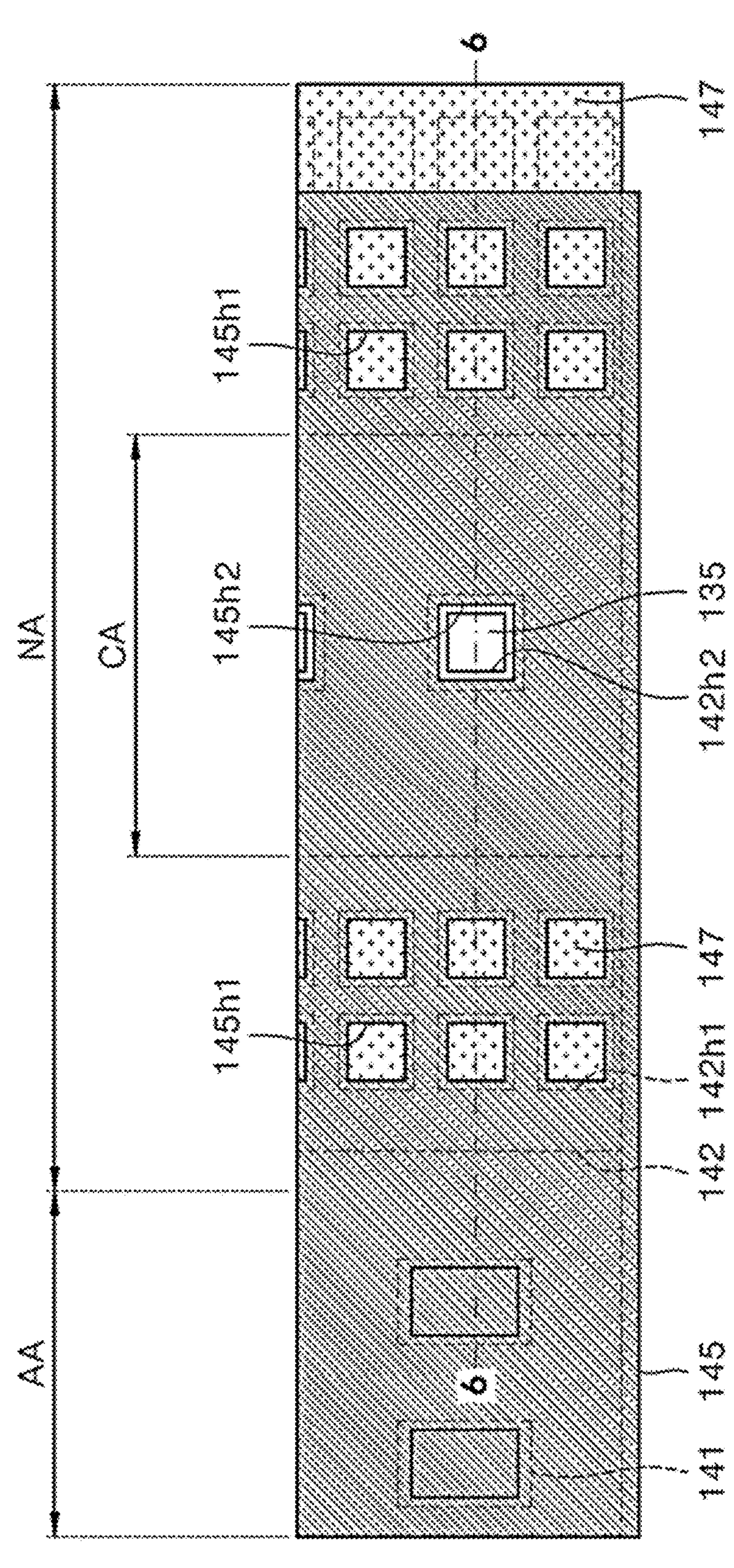
FIG. 5 is a plan view showing a partial area of a display device according to one embodiment of the present disclosure.
Figure 6:
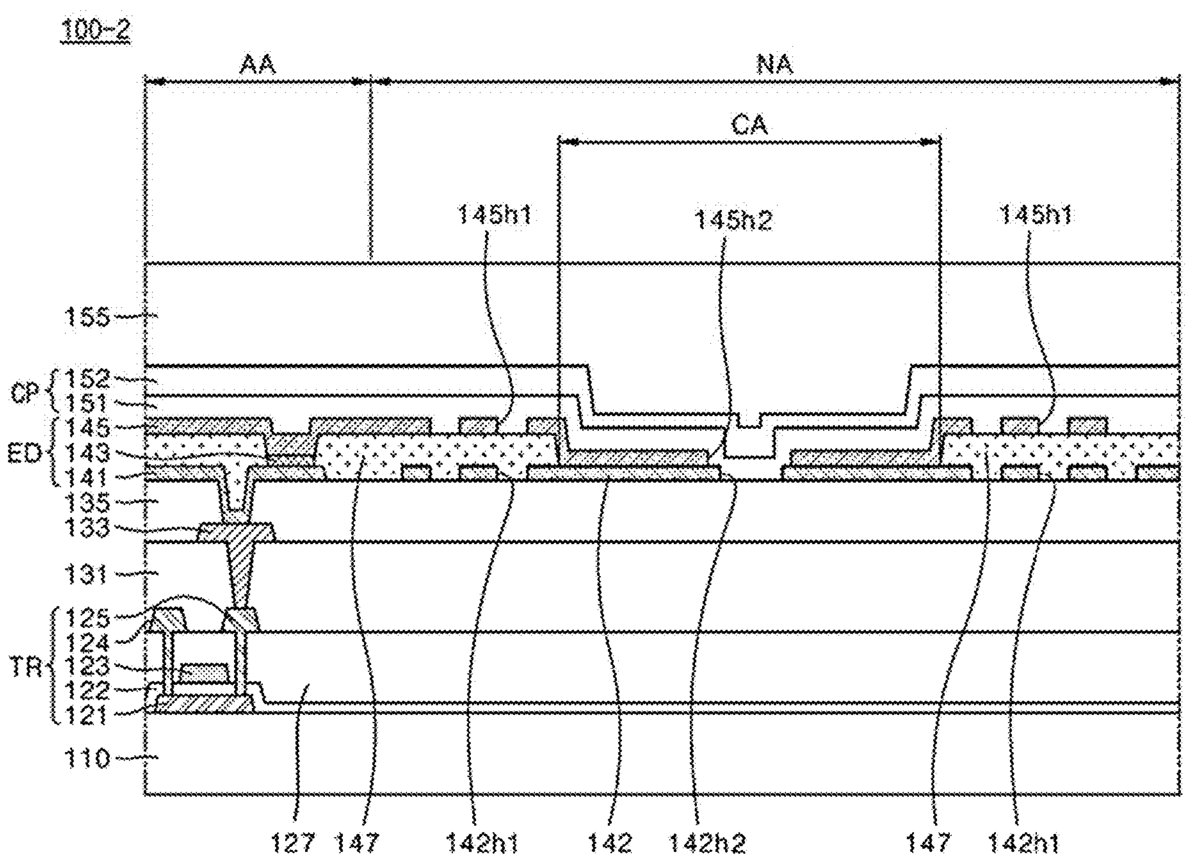
FIG. 6 is a cross-sectional view taken along line 6-6 of FIG. 5.

FIG. 5 is a plan view showing a partial area of a display device 100-2 according to one embodiment of the present disclosure. FIG. 6 is a cross-sectional view taken along line 6-6 of FIG. 5.

Referring to FIG. 5 and FIG. 6, the display device 100-2 according to one embodiment of the present disclosure is similar to the display device 100 according to one embodiment of the present disclosure. However, a structure of the contact area CA in the display device 100-2 is different from that in the display device 100.

In the display device 100-2, the intermediate contact layers 148 may not be disposed in the contact area CA. Therefore, in the plurality of areas in the contact area CA, the organic capping layer 151 of the capping layer CP can contact the planarization layer 135 through the second holes **145*h*2 of the common electrode 145 of the light-emitting element ED and the second holes 142*h*2 of the connection electrode 142**.

Each of the second holes **145*h*2 of the common electrode 145 of the light-emitting element ED can overlap each of the second holes 142*h*2 of the connection electrode 142** in the contact area CA.

The size of each of the second holes **145*h*2 of the common electrode 145 of the light-emitting element ED can be greater than the size of each of the second holes 142*h*2 of the connection electrode 142. A portion of the connection electrode 142 can be exposed through each of the second holes 145*h*2 of the common electrode 145** of the light-emitting element ED.

Alternatively, the size of each of the second holes **145*h*2 of the common electrode 145 of the light-emitting element ED can be equal to the size of each of the second holes 142*h*2 of the connection electrode 142**.

In this embodiment, the organic capping layer 151 contacts the planarization layer 135 in the plurality of areas of the contact area CA, while the organic capping layer 151 contacts the bank 147 in the plurality of areas around the contact area CA. Thus, even when an external shock is applied to the device, the common electrode 145 can be prevented from being disconnected from the connection electrode 142 in the contact area CA. Therefore, the common electrode 145 of the light-emitting element ED can be stably connected to the low-potential line.

A display device according to embodiments of the present disclosure can be described as follows.

One aspect of the present disclosure provides a display device comprising: a substrate including a display area and a non-display area, wherein the non-display area has at least one contact area disposed on at least one side of the display area; a planarization layer disposed on the substrate and including an organic material; a pixel electrode disposed on the planarization layer and in the display area; a connection electrode disposed on the planarization layer and in the non-display area, wherein the connection electrode is spaced apart from the pixel electrode; a bank disposed on the planarization layer so as to cover a portion of the pixel electrode and a portion of the connection electrode, wherein the bank includes an organic material; an organic light-emitting layer disposed on the pixel electrode; a common electrode disposed on the bank and the organic light-emitting layer; and an organic capping layer disposed on the common electrode, wherein the common electrode is in contact with the connection electrode in the contact area, wherein the common electrode has first holes defined therein exposing the bank, wherein the first holes are disposed in a portion of the non-display area adjacent to the contact area, and the organic capping layer is in contact with the bank through the first holes of the common electrode.

In one implementation of the present disclosure, the connection electrode has first holes defined therein exposing the planarization layer, the first holes of the connection electrode are disposed in the portion of the non-display area adjacent to the contact area, and the bank is in contact with the planarization layer through the first holes of the connection electrode.

In one implementation of the present disclosure, each of the first holes of the common electrode overlaps with a corresponding one of the first holes of the connection electrode.

In one implementation of the present disclosure, each of the first holes of the common electrode non-overlaps or does not overlap with any of the first holes of the connection electrode.

In one implementation of the present disclosure, the common electrode has second holes defined therein in the contact area, and a spacing between adjacent ones of the second holes of the common electrode is larger than a spacing between adjacent ones of the first holes of the common electrode.

In one implementation of the present disclosure, the connection electrode has second holes defined therein exposing the planarization layer, and the second holes of the connection electrode are disposed in the contact area.

In one implementation of the present disclosure, each of the second holes of the connection electrode overlaps with a corresponding one of the second holes of the common electrode.

In one implementation of the present disclosure, in the contact area, the organic capping layer is in contact with the planarization layer through the second holes of the common electrode and the second holes of the connection electrode.

In one implementation of the present disclosure, the display device further comprises intermediate contact layers disposed between the common electrode and the connection electrode in the contact area.

In one implementation of the present disclosure, the common electrode has second holes defined therein exposing the intermediate contact layers, wherein the second holes of the common electrode are disposed in the contact area, the connection electrode has second holes defined therein exposing the planarization layer, the second holes of the connection electrode are disposed in the contact area, the organic capping layer is in contact with the intermediate contact layers through the second holes of the common electrode, and the intermediate contact layers is in contact with the planarization layer through the second holes of the connection electrode.

In one implementation of the present disclosure, the intermediate contact layers and the bank are made of the same material and are disposed in the same layer.

Although the embodiments of the present disclosure have been described in more detail with reference to the accompanying drawings, the present disclosure is not necessarily limited to these embodiments, and can be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A display device comprising:

a substrate including a display area and a non-display area, wherein the non-display area has at least one contact area disposed on at least one side of the display area;

a planarization layer disposed on the substrate and including an organic material;

a pixel electrode disposed on the planarization layer and disposed in the display area;

a connection electrode disposed on the planarization layer and disposed in the non-display area, wherein the connection electrode is spaced apart from the pixel electrode;

a bank disposed on the planarization layer so as to cover a portion of the pixel electrode and a portion of the connection electrode, wherein the bank includes an organic material;

an organic light-emitting layer disposed on the pixel electrode;

a common electrode disposed on the bank and the organic light-emitting layer; and an organic capping layer disposed on the common electrode, wherein the common electrode is in contact with the connection electrode in the contact area, wherein the common electrode has first holes defined therein for exposing the bank, wherein the first holes of the common electrode are disposed in a portion of the non-display area adjacent to the contact area, and wherein the organic capping layer is in contact with the bank through the first holes of the common electrode.

2. The display device of claim 1, wherein the connection electrode has first holes defined therein for exposing the planarization layer, wherein the first holes of the connection electrode are disposed in the portion of the non-display area adjacent to the contact area, and wherein the bank is in contact with the planarization layer through the first holes of the connection electrode.

3. The display device of claim 2, wherein each of the first holes of the common electrode overlaps with one of the first holes of the connection electrode.

4. The display device of claim 2, wherein each of the first holes of the common electrode does not overlap with any of the first holes of the connection electrode.

5. The display device of claim 1, wherein the common electrode has second holes defined therein in the contact area, and wherein a spacing between adjacent ones of the second holes of the common electrode is larger than a spacing between adjacent ones of the first holes of the common electrode.

6. The display device of claim 5, wherein the connection electrode has second holes defined therein for exposing the planarization layer, and wherein the second holes of the connection electrode are disposed in the contact area.

7. The display device of claim 6, wherein each of the second holes of the connection electrode overlaps with one of the second holes of the common electrode.

8. The display device of claim 7, wherein in the contact area, the organic capping layer is in contact with the planarization layer through the second holes of the common electrode and the second holes of the connection electrode.

9. The display device of claim 1, wherein the display device further comprises intermediate contact layers disposed between the common electrode and the connection electrode in the contact area.

10. The display device of claim 9, wherein the common electrode has second holes defined therein for exposing the intermediate contact layers, wherein the second holes of the common electrode are disposed in the contact area, wherein the connection electrode has second holes defined therein for exposing the planarization layer, and wherein the second holes of the connection electrode are disposed in the contact area.

11. The display device of claim 10, wherein the organic capping layer is in contact with the intermediate contact layers through the second holes of the common electrode, and wherein the intermediate contact layers is in contact with the planarization layer through the second holes of the connection electrode.

12. The display device of claim 10, wherein the intermediate contact layers and the bank are made of a same material and are disposed in a same layer.

* * * * *